COATING APPARATUS FOR PRODUCING ELECTRICAL COMPONENTS

Filed Aug. 28, 1961

INVENTOR.
Clifford M. Ault,
BY
H. H. Losche
Paul J. Collignon
Attorneys.

United States Patent Office 3,205,855
Patented Sept. 14, 1965

3,205,855
COATING APPARATUS FOR PRODUCING ELECTRICAL COMPONENTS

Clifford M. Ault, 5341 Glencairn Lane, Indianapolis, Ind.
Filed Aug. 28, 1961, Ser. No. 134,477
1 Claim. (Cl. 118—49)
(Granted under Title 35, U.S. Code (1952), sec. 266)

The invention described herein may be manufactured and used by or for the Government of the United States of America for governmental purposes without the payment of any royalties thereon or therefor.

The present invention relates to a device and method for producing electronic components and more particularly to a device and method for producing integrated circuitry components by the deposition of thin films onto insulated substrates, such as glass, fused silica, or ceramic substrates.

There is a constant demand for smaller electrical and electronic components, particularly in the aircraft and missile fields, as weight is of extreme importance. One concept of microelectronics which is being presently investigated and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

Heretofore, when different materials were deposited onto substrates a first mask was used, and after depositing the desired amount of metal through the mask openings, the first mask was removed and then second and subsequent masks were employed. Since the depositing of the material is done in a vacuum chamber, the changing of the masks necessitated the loss of the vacuum each time, and thus the old process was both timely and costly.

The present invention provides for the deposition of a plurality of patterns onto an insulated base without having to interrupt the vacuum after each pattern is deposited. The insulated bases, or substrates, are supported by a rotatable carriage, which can be indexed to place one or more substrates over a depositing substance. A mask, which might be of thin plastic or metal, is provided with the desired patterns, and this mask is loaded onto spools which can be driven to position the desired pattern relative to the substrate. A second mask is provided to act as a shutter, or gate, to rapidly cut off the material that is being deposited.

It is therefore a general object of the present invention to provide both an improved device and an improved method for producing integrated circuitry on insulated bases.

Another object of the present invention is to provide an improved masking device for use in depositing thin films on substrates.

Still another object of the present invention is to provide an improved device and method for depositing a plurality of patterns on a substrate.

Other objects and advantages of the present invention will be readily appreciated as the same becomes better understood by reference to the following detailed description when considered in connection with the accompanying drawing wherein.

Figures 1, 2, 3, 4, 5, 6:
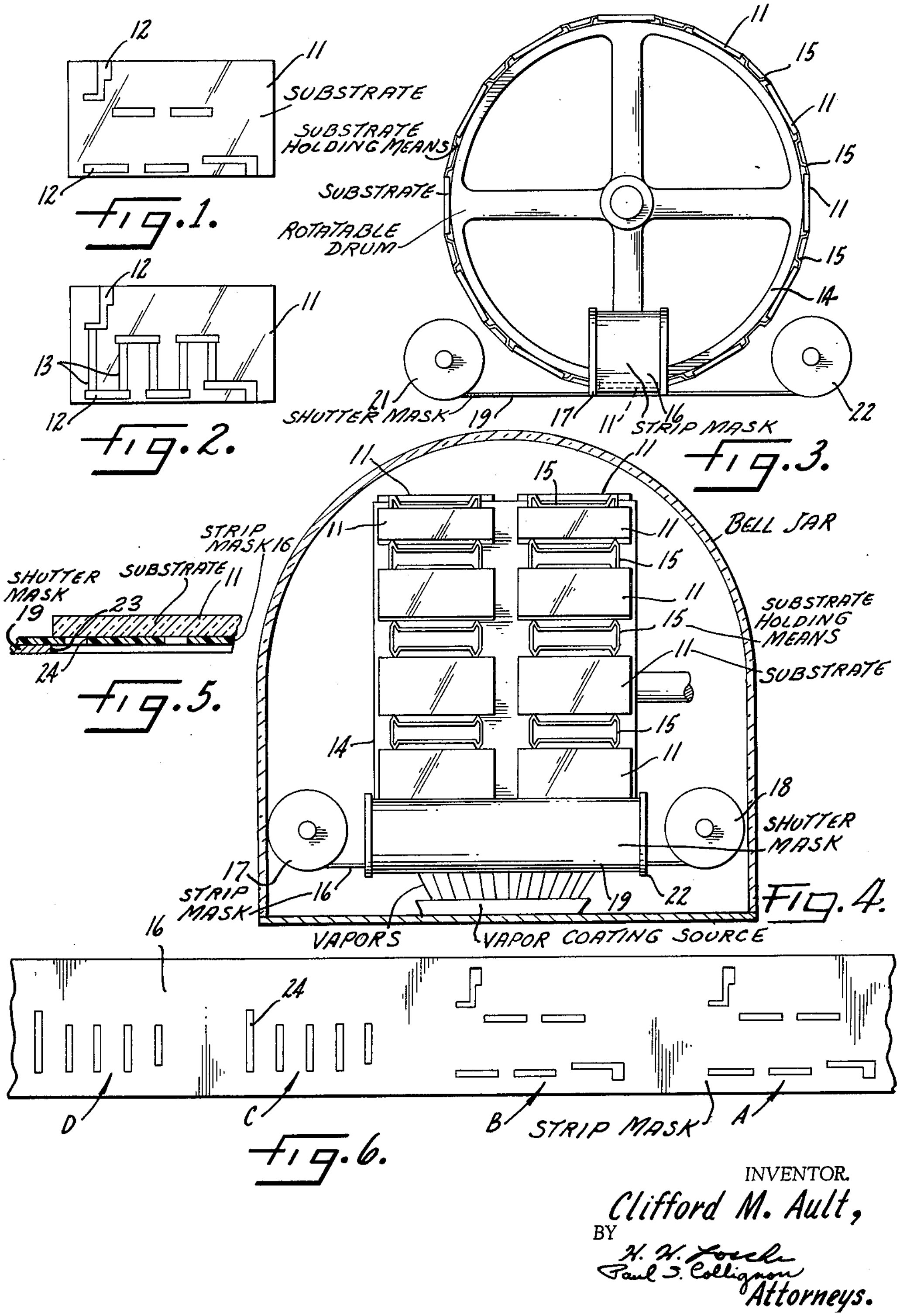
FIGURE 1 is a plan view showing one pattern on a substrate.
FIGURE 2 is a plan view showing various patterns on a substrate.
FIGURE 3 is a front view showing one embodiment of the present invention.
FIGURE 4 is a side view of the embodiment shown in FIGURE 3 of the drawing and showing the embodiment positioned within a vacuum chamber.
FIGURE 5 is an enlarged sectional view showing a substrate of masks.
FIGURE 6 is a plan view of a mask.

Referring to FIGURE 1 of the drawing, there is shown a substrate 11 having a plurality of conductors 12 thereon. The choice of conductor material is governed by a number of factors including adhesion to substrate and to adjacent layers, and compatibility with materials of adjacent layers. Metals such as chromium, titanium, and aluminum adhere tenaciously to other metals, glass and ceramics, but are extremely difficult to solder because they form an oxide coating. On the other hand, metals such as copper, gold, and silver are easily soldered, but do not adhere well to glass or ceramic. Consequently, it is often desirable to use two or more metals to obtain a satisfactory conductor, such for example, as by first depositing a layer of chromium, and then depositing a layer of gold on the chromium before the chromium has had time to form an oxide coating thereon.

As shown in FIGURE 2 of the drawing, a plurality of resistor elements 13 are provided on the substrate 11 and co-operate with the conductors 12 to form a portion of a circuit. A suitable thin film resistor material should be chemically inert to atmospheric gases, electrically and thermally stable, and relatively free of electrical and thermal noise. In addition, the film should be capable of adhering tenaciously to the substrate and have a coefficient of thermal expansion approximating that of the substrate material. One widely used thin film material is tin oxide which is deposited on a substrate by the hydrolysis of tin chloride. Other widely used materials are tantalum and nickel-chromium.

Referring now to FIGURES 3 and 4 of the drawing, there is shown a drum 14 that supports a plurality of substrates 11; two rows being shown for purpose of illustration. The substrates 11 are held to the drum 14 by any suitable means such as spring clips 15, so that the substrates may be quickly fastened and unfastened to the drum 14. Drum 14 may be electrically driven, and preferably is driven by an indexing means that rotates the drum a fixed amount each time the driving means is energized. For example, if there are twelve substrates in each row, then the drum should be rotated thirty degrees each time so that each substrate will be positioned to receive the material that is to be deposited.

A strip mask 16, which is shown in FIGURE 6 of the drawing, is attached to spools 17 and 18, and as shown in FIGURE 5, is positioned adjacent the substrates 11 that are to receive the evaporated material. Since two rows of substrates are shown, for purposes of illustration, on the drum 14, two identical patterns A and B are provided for screening on the conductors 12, and two identical patterns C and D are provided on the mask 16 for screening on the resistor elements 13. The strip mask 16 is made of any suitable material such as plastic or metal and is relatively thin so that it can be coiled on the supporting spools. The apertures are punched in the mask by any suitable means. A second mask 19 is attached to spools 21 and 22 and serves as a shield or gate to rapidly cut off the material being deposited. As shown in FIGURE 5 of the drawing, mask 19 is provided with a large aperture 23 that permits the full area of the substrate 11 to be exposed to the evaporating material. However, mask 16 permits the evaporating material to be deposited on the substrates 11 only where there is an aperture 24.

In operation, the substrates 11 are attached to the drum 14 and the entire assembly is placed in a vacuum chamber. After the desired vacuum is obtained, the evaporation of the material to be deposited is started and mask 16 is positioned so that patterns A and B are adjacent the first pair of substrates that are to be processed. When the evaporation of the material to be deposited has reached a desired rate, mask 19 is actuated so that the evaporated material can pass through aperture 23 of mask 19 and apertures 24 in mask 16 to make the desired conductor pattern shown in FIGURE 1 of the drawing. After a given amount of material has been deposited on the substrates, mask 19 is actuated to shut off the depositing of the material and drum 14 is indexed to position a second pair of substrates 11 relative to mask 16. After the conductive pattern has been deposited on all the substrates 11 which are mounted on drum 14, and the first pair is again in position above mask 16, mask 16 is actuated so that patterns C and D are in position. A resistive material is then evaporated in the vacuum chamber and deposited onto the substrates through aperture 23 in mask 19 and apertures 24 in mask 16. Drum 14 is again indexed so that each substrate 11 can have a resistive pattern deposited thereon.

While a two pattern operation has been described, that is, the formation of conductors and resistors, it is obvious that any number of patterns may be formed, it being only necessary to have the necessary apertures in mask 16 and then index mask 16 for each operation. For example, a circuit may contain conductors, resistors, capacitors and small inductors.

It can thus be seen that the present invention provides an improved device and method for making integrated circuitry components as it is possible to deposit two or more different materials onto substrates without having to interrupt the vacuum in which the depositing is being accomplished.

Obviously many modifications and variations of the present invention are possible in the light of the above teachings. It is therefore to be understood, that within the scope of the appended claims, the invention may be practiced otherwise than as specifically described.

What is claimed is:

In a device for producing electronic components by the evaporation of material from a vapor coating source in a vacuum chamber, a masking device comprising:

a shaft, a cylindrical drum rotatably mounted on said shaft, fastening means on the outer periphery of said cylindrical drum for holding a plurality of substrates, first and second rotatably mounted spools, a first mask of thin material having at least two sets of apertures therein, said mask being engageable with at least one of said substrates on the outer periphery of said cylindrical drum, one end of said mask being attached to said first spool and the other end of said mask being attached to said second spool, third and fourth rotatably mounted spools, and a second mask of thin material having an enlarged aperture therein, one end of said second mask being attached to said third spool and another end of said second mask being attached to said fourth spool whereby said second mask is adaptable for covering the apertures of said first mask.

References Cited by the Examiner

UNITED STATES PATENTS

| | | | |
|---|---|---|---|
| 2,610,606 | 9/52 | Weber | 118—49 |
| 2,848,359 | 8/58 | Talmey | 117—212 |
| 2,898,241 | 8/59 | Charlton | 117—212 |
| 2,948,261 | 8/60 | McGraw | 118—49 |
| 3,023,727 | 3/62 | Theodoseau et al. | 117—212 XR |

WILLIAM D. MARTIN, *Primary Examiner.*

RICHARD D. NEVIUS, MURRAY KATZ, *Examiners.*